(12) United States Patent
Sawataishi (10) Patent No.: US 10,088,510 B2
(45) Date of Patent: Oct. 2, 2018

(54) CAPACITANCE DETECTION APPARATUS AND INPUT APPARATUS

(71) Applicant: ALPS ELECTRIC CO., LTD., Tokyo (JP)

(72) Inventor: Tomoyuki Sawataishi, Miyagi-ken (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/391,528

(22) Filed: Dec. 27, 2016

(65) Prior Publication Data

US 2017/0184645 A1    Jun. 29, 2017

(30) Foreign Application Priority Data

Dec. 28, 2015  (JP) ................ 2015-257538

(51) Int. Cl.
  *G01R 27/26*  (2006.01)
  *G06F 3/041*  (2006.01)
  *G06F 3/044*  (2006.01)

(52) U.S. Cl.
  CPC ......... *G01R 27/2605* (2013.01); *G06F 3/044* (2013.01); *G06F 3/0416* (2013.01)

(58) Field of Classification Search
  CPC .... G01R 27/2605; G06F 3/044; G06F 3/0416
  See application file for complete search history.

(56) References Cited

U.S. PATENT DOCUMENTS

| | | | |
|---|---|---|---|
| 7,541,816 B1* | 6/2009 | Liao ................ | G06F 3/044 324/548 |
| 2008/0191713 A1* | 8/2008 | Hauer ............... | G01R 27/2605 324/658 |
| 2014/0035601 A1* | 2/2014 | Fujiyoshi ........... | G01R 35/00 324/684 |
| 2015/0145535 A1* | 5/2015 | Nys ................... | G06F 3/0418 324/679 |

* cited by examiner

*Primary Examiner* — Son Le
*Assistant Examiner* — Akm Zakaria
(74) *Attorney, Agent, or Firm* — Brinks Gilson & Lione (57) ABSTRACT

A voltage of a first capacitor is compared with a threshold voltage and a signal corresponding to the comparison result is generated at each of a first timing during a period after the transfer of a positive charge has ended and before the transfer of a negative charge starts and a second timing during a period after the transfer of the negative charge has ended and before the transfer of the positive charge starts. In each of the case where a positive charge is transferred and the case where a negative charge is transferred, operations (digitization of an integrated value and a feedback operation) of a delta sigma modulator are performed.

6 Claims, 7 Drawing Sheets

CAPACITANCE DETECTION APPARATUS AND INPUT APPARATUS

CLAIM OF PRIORITY

This application claims benefit of priority to Japanese Patent Application No. 2015-257538 filed on Dec. 28, 2015, which is hereby incorporated by reference in its entirety.

BACKGROUND

1. Field of the Disclosure

The present disclosure relates to a capacitance detection apparatus such as a capacitive sensor that detects capacitance and relates to an input apparatus such as a touchpad including the capacitance detection apparatus.

2. Description of the Related Art

An apparatus, such as a touchpad or touch panel, that includes a sensor for detecting a contact position of an object (for example, a finger, a pen) has been widely used as an input interface of an information apparatus such as a notebook PC, a tablet terminal, a smart phone, and the like. Existing various types of sensor that detects a contact position of an object include, for example, a resistance film method and a capacitance method. Recently, a sensor based on a capacitance method, which supports a "multi-touch" capability enabling detection of a plurality of contact positions, has been increasingly employed.

A sensor based on the capacitance method detects a voltage converted from a minute change in capacitance and, hence, is likely to be influenced by external noise. In the capacitance detection circuit disclosed in US2014/0035601A1, a charge provided from a sensor is continuously integrated by switching between the directions in which a capacitor inserted in the feedback path of a charge amplifier is connected during the rising period and falling period of the drive signal from the sensor. This allows external noise to be averaged and attenuated and, hence, influence from external noise is unlikely to be generated.

Figure 6:
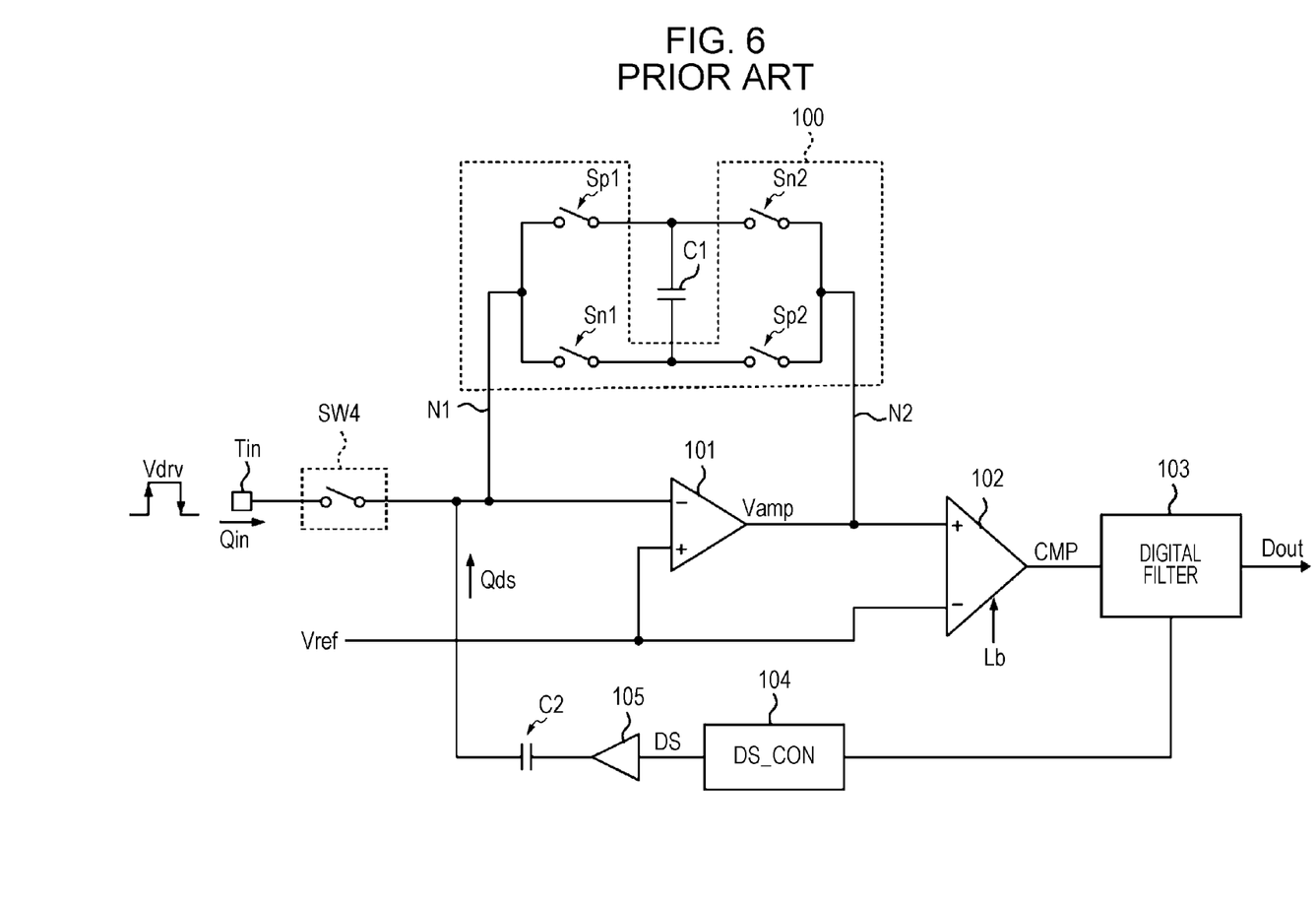
FIG. 6 is a diagram illustrating the configuration of the existing circuit.

FIG. 6 is a schematic diagram illustrating the configuration of the capacitance detection circuit disclosed in FIG. 13 of US2014/0035601A1. The existing circuit illustrated in FIG. 6 operates as a delta-sigma-type analog-digital converter including a comparator 102 with one-bit output and a digital filter 103.

In FIG. 6, a capacitor C1, a switch circuit 100, and an operational amplifier 101 form a charge amplifier accumulating a charge Qin transferred to an input terminal Tin. This charge amplifier continuously accumulates (integrates) positive and negative charges Qin using the capacitor C1 by switching the connection direction of the capacitor C1 inserted into a feedback path in accordance with the polarity of the charge Qin. Hence, the amplitude of an output voltage Vamp of the operational amplifier 101 increases with time. As illustrated in the timing chart of FIG. 7, when the positive charge Qin and the negative charge Qin are each accumulated once, a signal Lb enters a valid state and the comparator 102 operates, whereby the output voltage Vamp of the operational amplifier 101 is compared with a reference voltage. Hence, a signal CMP, which is the comparison result of the digital filter 103, is not output before the positive and negative charges Qin are each read once. When the period of the output of the signal CMP increases, a time required before the detected capacitance of a predetermined bit length is obtained increases.

The size of an input surface of the sensor of a recent touchpad or the like is has been tending to increase. As a result, the number of detection positions on the input surface is increasing and, hence, the number of detection signals obtained from the whole input surface is also increasing. On the other hand, in order to accurately capture the movement of a finger during a touch operation, a sensing speed needs to be a predetermined speed or higher and, hence, a time (scanning cycle time) for acquiring detection signals from the whole input surface is not allowed to increase so much even when the number of detection signals increases. Consequently, a sensing time at each detection position needs to be decreased, i.e., the speed of detecting capacitance needs to be increased.

Further, in a state in which a finger has been lifted from the input surface, or the finger is gloved, for example, a minute change in capacitance needs to be detected with high accuracy. In the case of a low detection speed, there is a problem of an increased influence of noise because noise immunity is reduced due to averaging.

In view of these situations, it is an object of the present invention to provide a capacitance detection apparatus and an input apparatus enabling an increase in the speed of detecting capacitance.

SUMMARY

The present invention provides a capacitance detection apparatus that includes: a charge accumulating circuit that includes a first capacitor having a first electrode and a second electrode, accumulates the transferred negative charge in the first electrode of the first capacitor, and accumulates the transferred positive charge in the second electrode of the first capacitor. A comparison circuit compares, at each of a first timing during a period after transfer of the positive charge has ended and before transfer of the negative charge starts and a second timing during a period after the transfer of the negative charge has ended and before the transfer of the positive charge starts, a voltage of the first capacitor, which is a voltage of the second electrode with respect to a voltage of the first electrode, with a threshold voltage, and outputs a signal corresponding to the comparison result. A feedback circuit that, in a case where a signal showing that the voltage of the first capacitor has exceeded the threshold voltage at the first timing is output from the comparison circuit, when a subsequent negative charge is transferred, inputs to the charge accumulating circuit a sum of the transferred negative charge and a positive charge that makes the voltage of the first capacitor lower than the threshold voltage, and in a case where a signal showing that the voltage of the first capacitor has exceeded the threshold voltage at the second timing is output from the comparison circuit, when a subsequent positive charge is transferred, inputs to the charge accumulating circuit a sum of the transferred positive charge and a negative charge that makes the voltage of the first capacitor lower than the threshold voltage.

According to the configuration described above, at each of a first timing during a period after the transfer of the positive charge has ended and before transfer of the negative charge starts and a second timing during a period after the transfer of the negative charge has ended and before the transfer of the positive charge starts, a voltage of the first capacitor, which is a voltage of the second electrode with respect to a voltage of the first electrode of the first capacitor, is compared with the threshold voltage and a signal corresponding to the comparison result is output from the comparison circuit.

Further, in the case where a signal showing that the voltage of the first capacitor has exceeded the threshold voltage at the first timing is output from the comparison circuit, when a subsequent negative charge is transferred, a sum of the transferred negative charge and a positive charge due to the feedback circuit is input to the charge accumulating circuit, and the voltage of the first capacitor becomes lower than the threshold voltage. Also in the case where a signal showing that the voltage of the first capacitor has exceeded the threshold voltage at the second timing is output from the comparison circuit, when a subsequent positive charge is transferred, a sum of the transferred positive charge and a negative charge due to the feedback circuit is input to the charge accumulating circuit, and the voltage of the first capacitor becomes lower than the threshold voltage of the first capacitor.

Hence, the detection speed is enhanced compared with the case where the result of comparison between the voltage of the capacitor and the threshold voltage is obtained only when two transfers of charges (positive charge, negative charge) are performed.

DESCRIPTION OF THE EXEMPLARY EMBODIMENTS

Hereinafter, embodiments of the present invention will be described with reference to the drawings.

Figure 1:
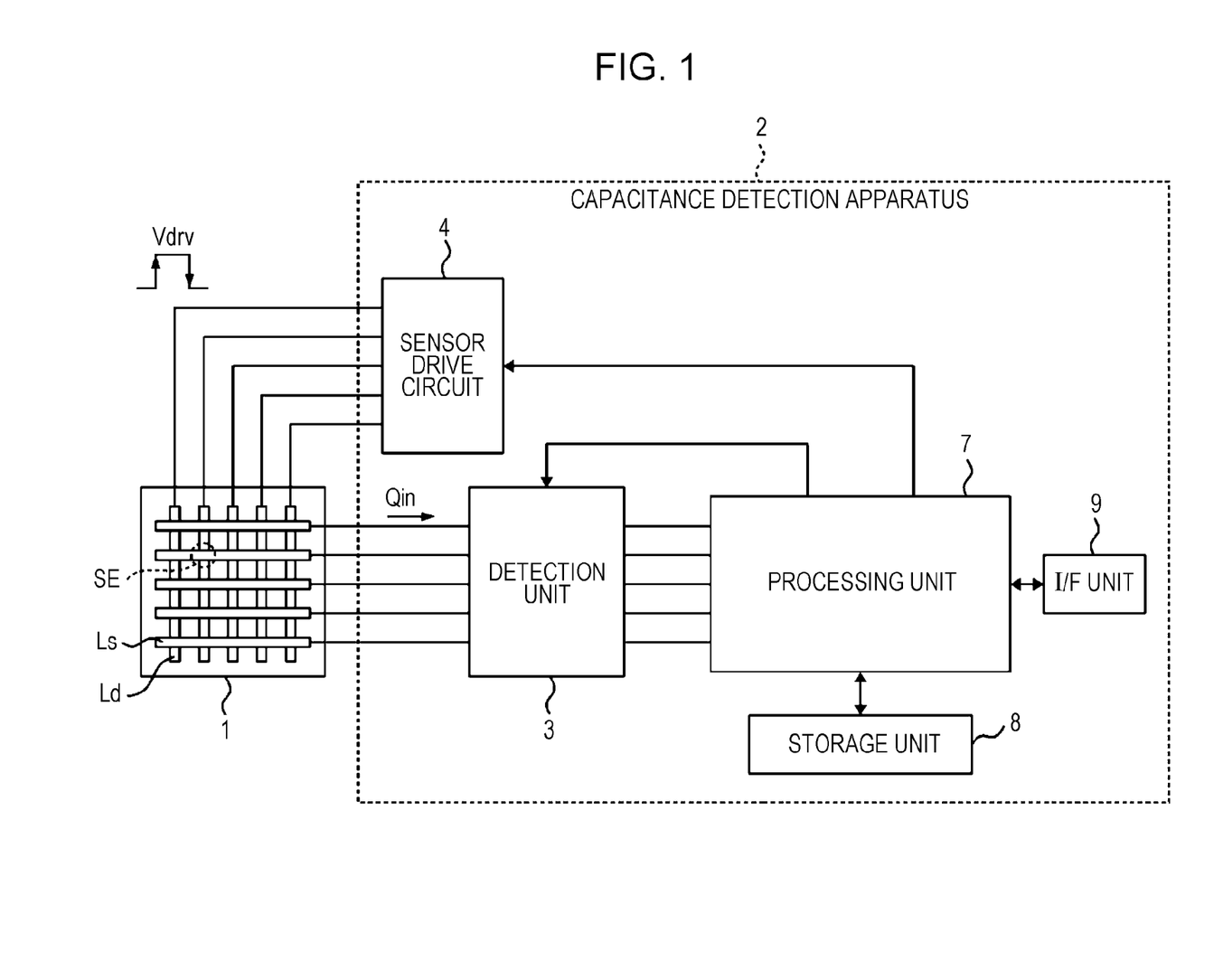
FIG. 1 is a diagram illustrating an example of the configuration of an input apparatus according to an embodiment of the present invention.

FIG. 1 is a diagram illustrating an example of the configuration of an input apparatus according to an embodiment.

The input apparatus illustrated in FIG. 1 includes a sensor matrix 1 including a plurality of capacitive sensors SE and a capacitance detection apparatus 2 that detects the capacitances of the capacitive sensors SE.

The input apparatus according to the present embodiment comprises an apparatus that receives information corresponding to the operations of an object such as a finger or a pen in the vicinity of an input surface where the plurality of capacitive sensors SE of the sensor matrix 1 are arranged, and is, for example, an apparatus such as a touchpad or a touch panel. In the present specifications, "vicinity of" means "near", and may be used to denote "in contact with and without in contact with".

The sensor matrix 1 includes a plurality of (five in the example of FIG. 1) detection electrodes Ls extending in the X direction and a plurality of (five in the exampled o FIG. 1) drive electrodes Ld extending in the Y direction. The plurality of detection electrodes Ls are arranged in parallel with one another in the Y direction and the plurality of drive electrodes Ld are arranged in parallel with one another in the X direction. The X direction and the Y direction are orthogonal to each other. The plurality of detection electrodes Ls and the plurality of drive electrodes Ld intersect one another to form a lattice when viewed in plan, and a capacitive sensor SE is formed near each of the intersections. Note that in the example illustrated in FIG. 1, each electrode (Ls, Ld) is shaped like a strip, but the electrodes may have any shape (for example, they may form a diamond pattern).

The capacitance detection apparatus 2 includes a detection unit 3 detecting capacitances, a sensor drive circuit 4 that supplies a drive voltage for capacitance detection to each of the drive electrodes Ld of the sensor matrix 1, a processing unit 7, a storage unit 8, and an interface unit 9.

The sensor drive circuit 4 applies a drive voltage whose level periodically changes to each of the capacitive sensors SE. For example, the sensor drive circuit 4, in accordance with the control of the processing unit 7, selects one of the drive electrodes Ld in sequence and makes the potential of the selected one drive electrode Ld periodically change. As a result of the potential of the drive electrode Ld changing, a drive voltage applied to the capacitive sensor SE formed near the intersection of the drive electrode Ld and a corresponding detection electrode Ls changes, such that charging or discharging is generated in the capacitive sensor SE.

The detection unit 3 detects the capacitance of each of the capacitive sensors SE of the sensor matrix 1. When the level of the drive electrode Ld changes periodically due to a drive voltage Vdrv of the sensor drive circuit 4, a charge corresponding to the change in the level of the drive voltage Vdrv is accumulated in or released from a corresponding capacitive sensor SE, and the charge is transferred to the capacitance detection apparatus 2 through a corresponding detection electrode Ls. The charge transferred from the capacitive sensor SE to the capacitance detection apparatus 2 has a magnitude corresponding to the capacitance of the capacitive sensor and its polarity is alternately inverted in accordance with the periodical change in level of the drive voltage Vdrv. The detection unit 3 continuously samples (accumulates) the positive charge and negative charge transferred from the capacitive sensor SE at timings in synchronization with the periodical change in the drive voltage Vdrv, and detects the capacitance on the basis of the sampled charges.

Figure 2:
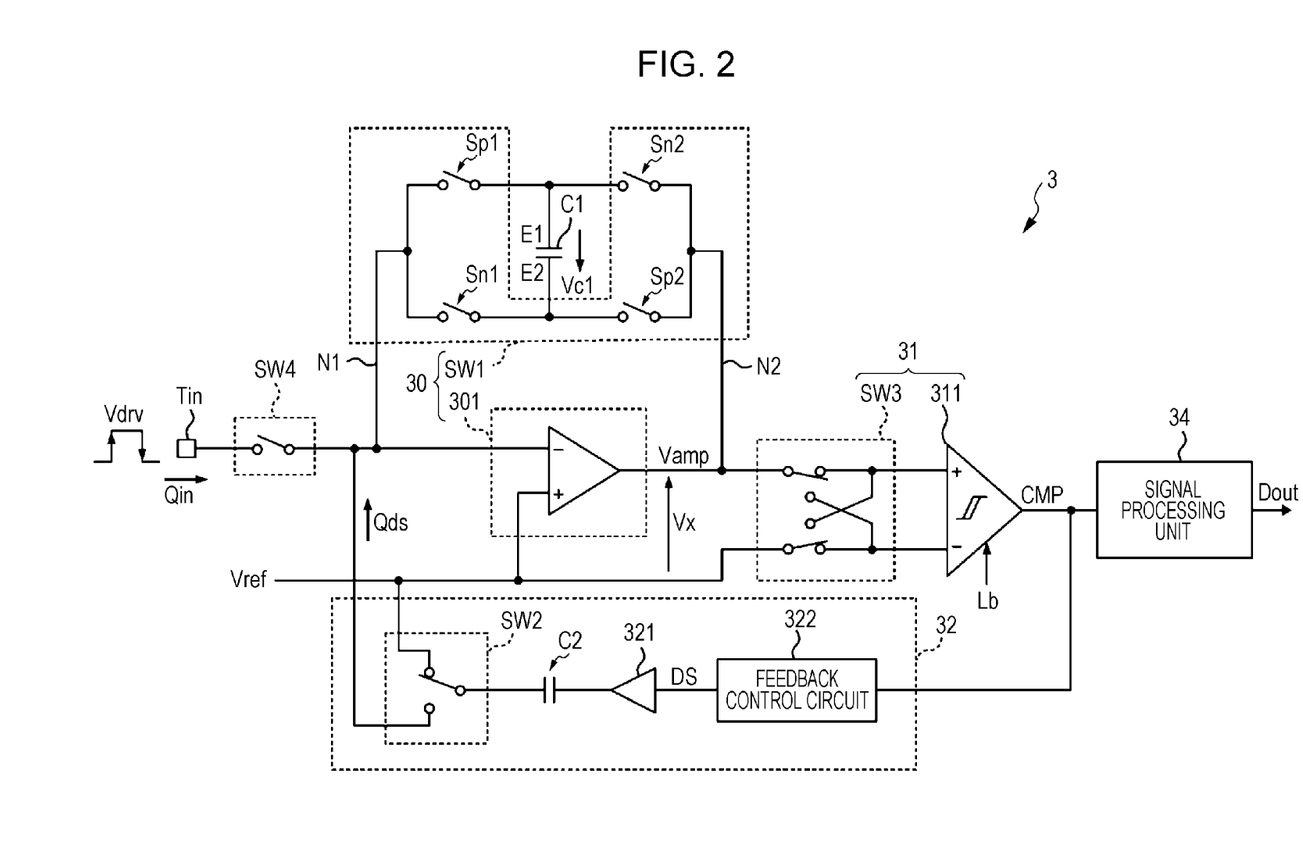
FIG. 2 is a diagram illustrating an example of the configuration of a detection unit.

FIG. 2 is a diagram illustrating an example of the configuration of the detection unit 3. The detection unit 3 illustrated in FIG. 2 includes a charge accumulation circuit 30, a comparison circuit 31, a feedback circuit 32, an input switch circuit SW4, and a signal processing unit 34. Note that the example of FIG. 2 illustrates a single block that detects the capacitance of one of the capacitive sensors SE on the basis of a charge transferred through one of the detection electrodes Ls. Regarding the detection unit 3, the block illustrated in FIG. 2 may be provided for each of the plurality of detection electrodes Ls, or the block illustrated in FIG. 2 may be selectively connected to each of the detection electrodes Ls through a selector.

The charge accumulation circuit 30 is a circuit that accumulates a charge transferred from the capacitive sensor SE and includes a first capacitor C1 for accumulating the charge transferred from the capacitive sensor SE. The first capacitor C1 includes a first electrode E1 and a second electrode E2. The charge accumulation circuit 30 accumulates a negative charge transferred from the capacitive sensor SE in the first electrode E1 of the first capacitor C1, and accumulates a positive charge transferred from the capacitive sensor SE in the second electrode E2. When the charge accumulation circuit 30 repeats this charge accumulation operation, a voltage Vc1 of the second electrode E2 increases with respect to the first electrode E1 of the first capacitor C1.

In the example of FIG. 2, the charge accumulation circuit 30 further includes a first switch circuit SW1 and a voltage control circuit 301.

The first switch circuit SW1 switches connection between the first electrode E1 as well as the second electrode E2 of the first capacitor C1 and a first node N1 as well as a second node N2. The first node N1 is connected to the input terminal Tin through the input switch circuit SW4 described later. Since the input terminal Tin is connected to the detection electrode Ls, a positive charge and a negative charge are alternately transferred to the first node N1 from the capacitive sensor SE.

The first switch circuit SW1, during a charge transfer period Xn in which a negative charge is transferred to the first node N1, connects the first electrode E1 of the first capacitor C1 to the first node N1 and connects the second electrode E2 of the first capacitor C1 to the second node N2, and during a charge transfer period Xp in which a positive charge is transferred to the first node N1, connects the second electrode E2 of the first capacitor C1 to the first node N1 and connects the first electrode E1 of the first capacitor C1 to the second node N2.

Specifically, the first switch circuit SW1, after the comparison result of the charge transfer period Xp has been fixed in the comparison circuit 31 (after a first timing TM1 described later), before a subsequent charge transfer period Xn begins, connects the first electrode E1 of the first capacitor C1 to the first node N1 and connects the second electrode E2 of the first capacitor C1 to the second node N2, and then maintains the connection state until the comparison result of the charge transfer period Xn in the comparison circuit 31 is determined in the comparison circuit 31 (until a second timing TM2 described later). The first switch circuit SW1, after the comparison result of the charge transfer period Xn is determined in the comparison circuit 31 (after the second timing TM2), connects the second electrode E2 of the first capacitor C1 to the first node N1 and connects the first electrode E1 of the first capacitor C1 to the second node N2 before the subsequent charge transfer period Xp starts, and maintains the connection state until the comparison result of the charge transfer period Xp is determined (until a first timing TM1) in the comparison circuit 31.

In the example of FIG. 2, the first switch circuit SW1 includes switches Sp1 and Sp2, and switches Sn1 and Sn2. The switch Sp1 is connected between the first electrode E1 and the first node N1 and the switch Sp2 is connected between the second electrode E2 and the second node N2. The switch Sn1 is connected between the second electrode E2 and the first node N1 and the switch Sn2 is connected between the first electrode E1 and the second node N2. The switches Sp1 and Sp2 are turned on during the charge transfer period Xn and are turned off during the other period. The switches Sn1 and Sn2 are turned on during the charge transfer period Xp and are turned off during the other period.

The voltage control circuit 301 is a circuit that controls the output voltage Vamp of the second electrode E2 such that the voltage of the first node N1 is made equal to a reference voltage Vref, and is formed of an operational amplifier in the example of FIG. 1. In the operational amplifier, the first node N1 is connected to the inverting input terminal, the reference voltage Vref is input to the non-inverting input terminal, and the second node N2 is connected to the output terminal.

At each of the first timing TM1 during a period after the transfer of a positive charge from the capacitive sensor SE has ended and before the transfer of a negative charge starts and the second timing TM2 during a period after the transfer of the negative charge from the capacitive sensor SE has ended and before the transfer of a positive charge starts, the comparison circuit 31 compares the voltage Vc1 of the first capacitor C1 (voltage of the second electrode E2 with respect to the voltage of the first electrode E1) with a threshold voltage and outputs a signal CMP corresponding to the comparison result at each of the second timings TM2.

In the example of FIG. 2, the comparison circuit 31, instead of directly measuring the voltage Vc1 of the first capacitor C1, refers to a voltage Vx(=Vamp−Vref), which is a voltage difference between the output voltage Vamp of the voltage control circuit 301 and the reference voltage Vref. The voltage Vx is approximately equal to the voltage difference between the second node N2 and the first node N1 and, hence, approximately equal to a voltage obtained by periodically inverting the polarity of the voltage Vc1 of the first capacitor C1. The comparison circuit 31, by inverting the polarity of the voltage Vx so as to cancel out this periodic polarity inversion, reproduces the voltage Vc1 of the first capacitor C1 without polarity inversion and compares this with a threshold voltage. As described later, when the threshold voltage is zero, the voltage comparison can be easily performed by a comparator.

The comparison circuit 31 includes, for example, a comparator 311 and a third switch circuit SW3.

The comparator 311 compares the voltages of a first input terminal (−) with a second input terminal (+) at the first timing TM1 and the second timing TM2, and outputs the signal CMP corresponding to this comparison result. For example, the comparator 311 outputs the signal CMP corresponding to the result of comparison between the voltages of the first input terminal (−) and the second input terminal (+) when the signal Lb becomes "1", and maintains (latches) the value of the signal CMP when the signal Lb changes from "1" to "0". In this case, the timings at which the signal Lb changes from "1" to "0" correspond to the first timing TM1 and the second timing TM2 described above.

The comparator 311 is, for example, a comparator with hysteresis, and inverts the signal CMP from "0" to "1" when the second input terminal (+) becomes higher than the first input terminal (−) by a certain voltage ΔV1, and inverts the signal CMP from "1" to "0" when the second input terminal (+) becomes lower than the first input terminal (−) by a certain voltage ΔV2. The voltages ΔV1 and ΔV2 are set to small values to an extent that generation of oscillation of the signal CMP due to the influence of, for example, noise is suppressed when the voltages of first input terminal (−) and the second input terminal (+) become approximately equal (the voltage Vc1 becomes approximately zero) is suppressed.

The third switch circuit SW3 connects the first input terminal (−) to the second node N2 and connects the second input terminal (+) to the reference voltage Vref at the first timing TM1, and connects the second input terminal (+) to the second node N2 and connects the first input terminal (−) to the reference voltage Vref at the second timing TM2.

For example, the third switch circuit SW3 switches the connection at the same timing as the first switch circuit SW1.

Specifically, the third switch circuit SW3, before and after the charge transfer period Xn during which a negative charge is transferred from the capacitive sensor SE, when the first electrode E1 of the first capacitor C1 is connected to the first node N1 and the second electrode E2 of the first capacitor C1 is connected to the second node N2, connects the second input terminal (+) to the second node N2 and connects the first input terminal (−) to the reference voltage Vref. In this case, the polarity of the voltage Vx is the same as that of the voltage Vc1 and the voltage Vx increases in accordance with the accumulation of a charge in the first capacitor C1. When the voltage Vx increases to above zero and becomes higher than a voltage $\Delta V1$ of the hysteresis of the comparator 311, the comparator 311 inverts the signal CMP from "0" to "1".

On the other hand, the third switch circuit SW3, before and after the charge transfer period Xp during which a positive charge is transferred from the capacitive sensor SE, when the second electrode E2 of the first capacitor C1 is connected to the first node N1 and the first electrode E1 of the first capacitor C1 is connected to the second node N2, connects the first input terminal (−) to the second node N2 and connects the second input terminal (+) to the reference voltage Vref. In this case, the polarity of the voltage Vx is opposite to that of the voltage Vc1 and the voltage Vx decreases in accordance with the accumulation of a charge in the first capacitor C1. When the voltage Vx decreases to below zero and becomes lower than a voltage $-\Delta V2$ of the hysteresis of the comparator 311, the comparator 311 inverts the signal CMP from "0" to "1".

In the case where the comparison circuit 31 outputs the signal CMP of "1" which shows that the voltage Vc1 of the first capacitor C1 has exceeded a threshold voltage (zero) at the first timing TM1 after the transfer of positive charge has ended, the feedback circuit 32, when the subsequent negative charge is transferred, adds a positive charge to the transferred negative charge and inputs the sum to the charge accumulation circuit 30. The amount of this positive charge is larger than that of the negative charge transferred from the capacitive sensor SE and, hence, the voltage Vc1 of the first capacitor C1 is made to be lower than a threshold voltage (zero).

In the case where the comparison circuit 31 outputs the signal CMP of "1" which shows that the voltage Vc1 of the first capacitor C1 has exceeded a threshold voltage (zero) at the second timing TM2 after the transfer of positive charge has ended, the feedback circuit 32, when the subsequent positive charge is transmitted, adds a negative charge to the positive charge and inputs the sum to the charge accumulation circuit 30. The amount of this negative charge is larger than that of the positive charge transferred from the capacitive sensor SE, and hence, the voltage Vc1 of the first capacitor C1 is made to be lower than a threshold voltage (zero).

In other words, when the voltage Vc1 that continues to increase due to accumulation of charge in the first capacitor C1 has exceeded a threshold voltage (zero), the feedback circuit 32 supplies a fixed charge to the first capacitor C1 such that the voltage Vc1 is made to be lower than the threshold voltage (zero).

The feedback circuit 32 includes, for example, a second capacitor C2, a second switch circuit SW2, a drive circuit 321, and a feedback control circuit 322.

The second switch circuit SW2 connects one terminal of the second capacitor C2 to the first node N1 during the charge transfer periods Xp and Xn, and connects the one terminal of the second capacitor C2 to the reference voltage Vref during intervals between the charge transfer periods Xp and Xn.

The feedback circuit 32 can switch the output voltage level from one of a level higher than the reference voltage Vref and a level lower than the reference voltage Vref to the other, and is configured to include, for example, a buffer circuit that can output a high-level voltage close to the power supply voltage and a low-level voltage close to the ground level.

In the case where the comparison circuit 31 outputs the signal CMP of "1" which shows that the voltage Vc1 of the first capacitor C1 has exceeded the threshold voltage at the first timing TM1 or the second timing TM2, the feedback control circuit 322 outputs a signal DS that switches the output voltage level of the drive circuit 321 during the subsequent charge transfer periods (Xp, Xn). When the level of the output voltage of the drive circuit 321 is switched, charging or discharging is generated in the second capacitor C2, and a feedback charge Qds accompanying this is supplied to the first node N1 through the second switch circuit SW2. The feedback charge Qds is added to the charge Qin (also called the transferred charge Qin) transferred from the capacitive sensor SE at the first node N1 and input to the charge accumulation circuit 30.

On the other hand, in the case where the comparison circuit 31 outputs the signal CMP of "0" which shows that the voltage Vc1 of the first capacitor C1 has not exceeded the threshold voltage during the first timing TM1 or the second timing TM2, the feedback control circuit 322 outputs the signal DS that switches the output voltage level of the drive circuit 321 after the subsequent charge transfer period (Xp, Xn) has ended. Also in this case, charging or discharging is generated in the second capacitor C2 and the charge accompanying this is generated, but this charge is not added to the transferred charge Qin and is ejected to a line supplying the reference voltage Vref through the second switch circuit SW2. Since the reference voltage Vref is approximately equal to the voltage of the first node N1, the charge accumulated in the second capacitor C2 at this time is approximately the same as that in the case where the second capacitor C2 is connected to the first node N1.

The input switch circuit SW4, which is provided on the path that transfers the positive and negative charges from the capacitive sensor SE to the first node N1, is turned on during the charge transfer periods (Xp, Xn) and turned off during intervals between the charge transfer periods (Xp, Xn). The connection of the second switch circuit SW2 of the feedback circuit 32 is switched at the same timing as the input switch circuit SW4.

The signal processing unit 34 makes the signal CMP output in the comparison circuit 31 be subjected to digital filter processing (low-pass filter processing, decimation processing, and the like), and generates a digital value with a predetermined bit length that shows the detected capacitance.

The detection unit 3 has been described above.

Referring back to FIG. 1, the processing unit 7 is a circuit for control of the overall operation of the input apparatus, and is configured to include, for example, a computer that performs processing in accordance with the instruction code of a program stored in the storage unit 8 described later and logic circuits realizing specific functions. The processing of the processing unit 7 may be entirely implemented by the computer and programs or may be partially or entirely implemented by dedicated logic circuits.

The detection unit 3 and the sensor drive circuit 4 are controlled by the processing unit 7 so as to perform a periodic detection operation for each cycle of detecting a change in capacitance generated when an object (a finger, a pen, or the like) comes close to the plurality of capacitive sensors SE distributed on the input surface. Specifically, the processing unit 7 controls these circuits such that selection of a drive electrode Ld and generation of a drive voltage in the sensor drive circuit 4 as well as sampling of a charge at a detection electrode Ls in the detection unit 3 are periodically performed at relevant timings. For example, the processing unit 7 generates control signals for the first switch circuit SW1, the second switch circuit SW2, the third switch circuit SW3, and the input switch circuit SW4 and the signal Lb for the comparator 311, described above.

The processing unit 7 performs detection of an object in contact with the input surface, computation of the coordinates of the contact position of the object, and the like on the basis of the capacitance values of the capacitive sensors SE detected by the detection unit 3.

The storage unit 8 stores constant data and variable data used in processing performed in the processing unit 7. When the processing unit 7 includes a computer, the storage unit 8 may store a program executed in the computer. The storage unit 8 is configured to include, for example, a volatile memory such as a DRAM or an SRAM, a non volatile memory such as a flash memory, a hard disk, and the like.

The interface unit 9 is a circuit for communicating data between an input apparatus and another apparatus (a control IC of an information apparatus on which the input apparatus or the like is mounted). The processing unit 7 outputs information stored in the storage unit 8 from the interface unit 9 to a control apparatus or the like (not illustrated). The interface unit 9 may obtain a program executed by the computer of the processing unit 7 from a disk drive apparatus (not illustrated) (apparatus for reading a program recorded on a non-volatile storage medium) or a server and load it in the storage unit 8.

Here, in the input apparatus according to the present embodiment having the configuration described above, the operation of the capacitance detection apparatus 2 that detects the charges of the capacitive sensors SE will be explained.

Figure 3:
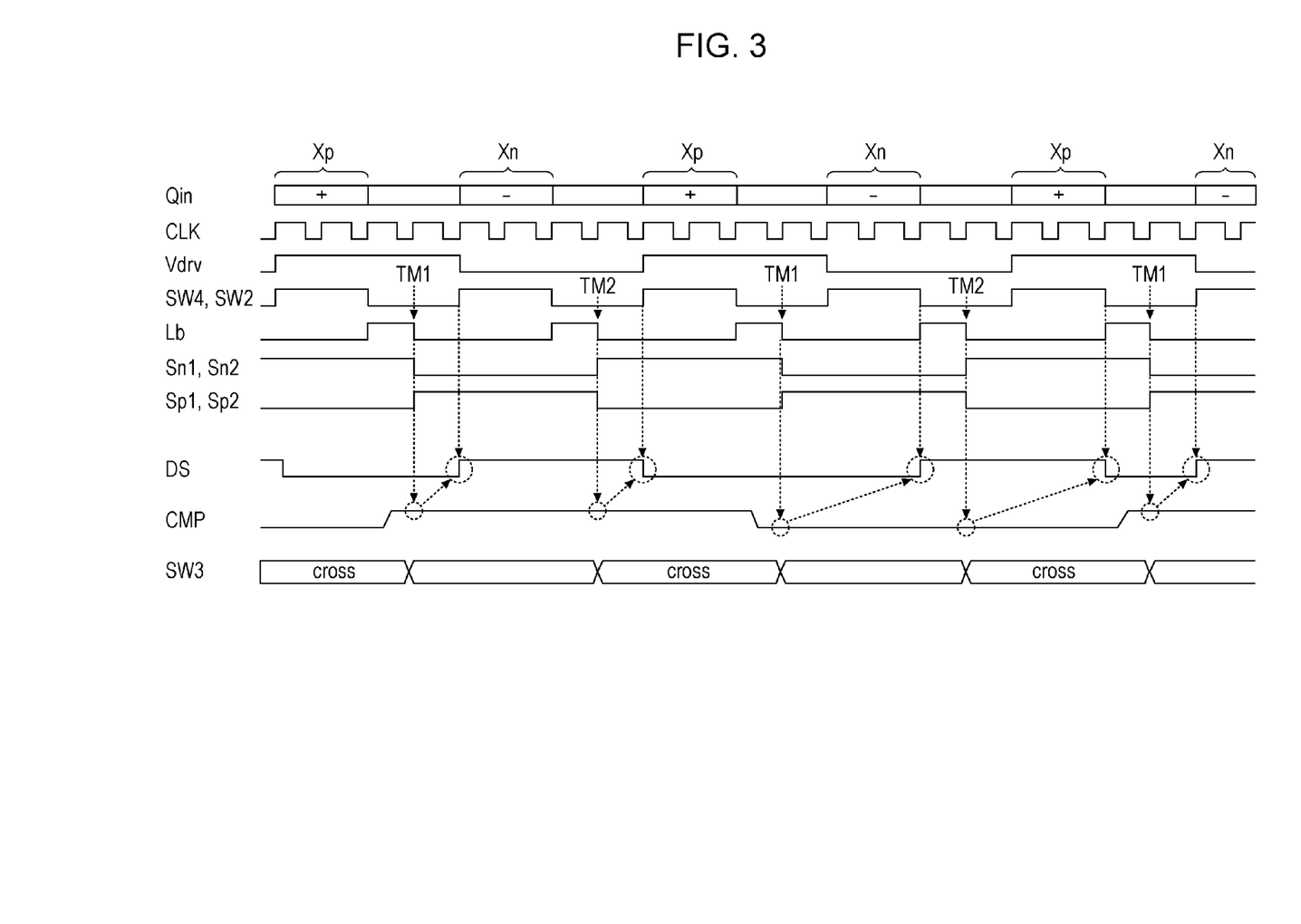
FIG. 3 is a diagram illustrating an example of a timing chart illustrating the operation timings of the portions of a capacitance detection apparatus according to the present embodiment.

FIG. 3 is a diagram illustrating an example of a timing chart showing the operation timings of the portions of the capacitance detection apparatus 2 according to the present embodiment.

In FIG. 3, "CLK" illustrates a clock signal which is a reference signal for the operation of the capacitance detection apparatus 2. In the chart of the third switch circuit SW3, "cross" denotes a period during which the voltage Vx with an inverted polarity is input to the comparator 311, i.e., a period during which the first input terminal (−) is connected to the second node N2 and the second input terminal (+) is connected to the reference voltage Vref.

At the start time of the charge transfer periods (Xp, Xn), the level of the drive voltage Vdrv is inverted, charging or discharging is generated in the capacitive sensors SE, and the charges are transferred to the capacitance detection apparatus 2 through the detection electrodes Ls. During the charge transfer periods (Xp, Xn), the input switch circuit SW4 is turned on and, hence, the charges of the capacitive sensors SE are transferred to the first node N1. At this time, when the level of the output voltage of the drive circuit 321 is switched due to the signal DS, the feedback charge Qds is generated due to the charging or discharging of the second capacitor C2, and this feedback charge Qds is supplied to the first node N1 through the second switch circuit SW2.

When the charge transfer periods (Xp, Xn) end, the signal Lb rises from "0" to "1" and a comparison operation is performed in the comparison circuit 31. When the signal Lb falls from "1" to "0", the signal CMP showing the comparison result at that time is held in the comparison circuit 31 and the comparison result of the comparison circuit 31 is determined. When the comparison result is determined, the connection of the first switch circuit SW1 is switched (Sp1, Sp2, Sn1, Sn2) before the subsequent charge transfer period (Xp, Xn) begins. The connection of the third switch circuit SW3 is also switched in accordance with the switching of the connection of the first switch circuit SW1.

After the charge transfer period Xp of a positive charge has ended, when the signal CMP is "1" at the first timing TM1 at which the signal Lb rises from "0" to "1", the logical value of the signal DS is inverted when the subsequent charge transfer period Xn of a negative charge starts, and the output voltage level of the drive circuit 321 is switched. As a result, the positive feedback charge Qds is supplied from the second capacitor C2 to the first node N1, and the voltage Vc1 of the first capacitor C1 becomes lower than zero. Similarly, after the charge transfer period Xn of a negative charge has ended, when the signal CMP is "1" at the second timing TM2 at which the signal Lb rises from "0" to "1", the logical value of the signal DS is inverted when the subsequent charge transfer period Xp of a positive charge starts, and the output voltage level of the drive circuit 321 is switched. As a result, the negative feedback charge Qds is supplied from the second capacitor C2 to the first node N1, and the voltage Vc1 of the first capacitor C1 becomes lower than 0 V.

On the other hand, when the signal CMP is "0" at the first timing TM1 or the second timing TM2, during the subsequent charge transfer period (Xp, Xn), the feedback charge Qds due to the feedback circuit 32 is not supplied to the first node N1. The charge due to the feedback circuit 32 is ejected to a reference voltage Vref supply line through the second switch circuit SW2 after the charge transfer period (Xp, Xn) has ended.

Note that since the voltage of the first node N1 and the reference voltage Vref are approximately equal, the amount of charge generated when the output voltage of the drive circuit 321 is switched subsequent time in the case where the feedback charge Qds is supplied from the second capacitor C2 to the first node N1 is about the same as that in the case where a charge is ejected from the second capacitor C2 to the reference voltage Vref supply line.

Figure 4:
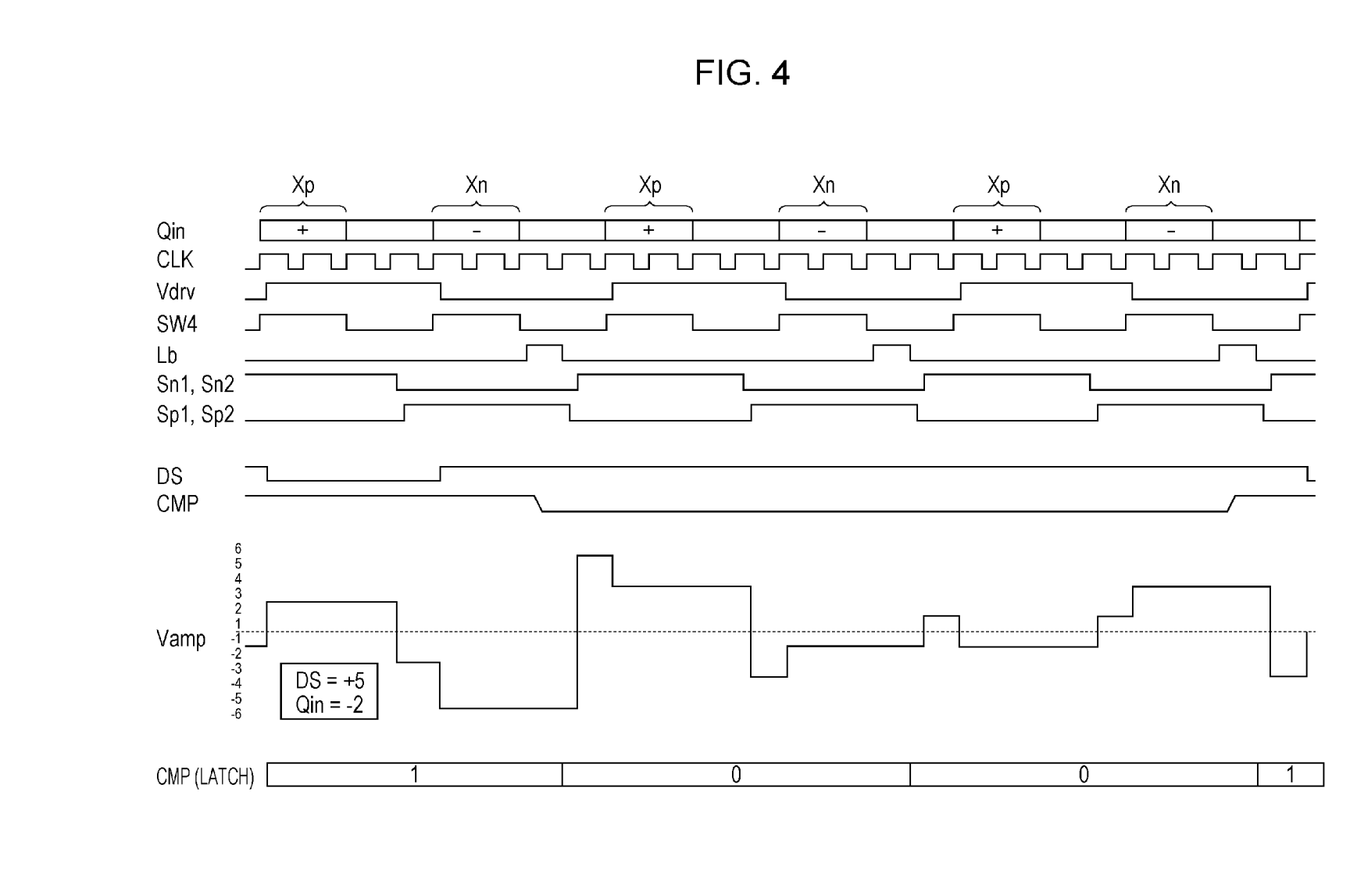
FIG. 4 is a diagram for describing a comparison example between the capacitance detection apparatus according to the present embodiment and an existing circuit illustrated in FIG. 6, and is a timing chart illustrating the operation timings of the portions of the existing circuit illustrated in FIG. 6.
Figure 5:
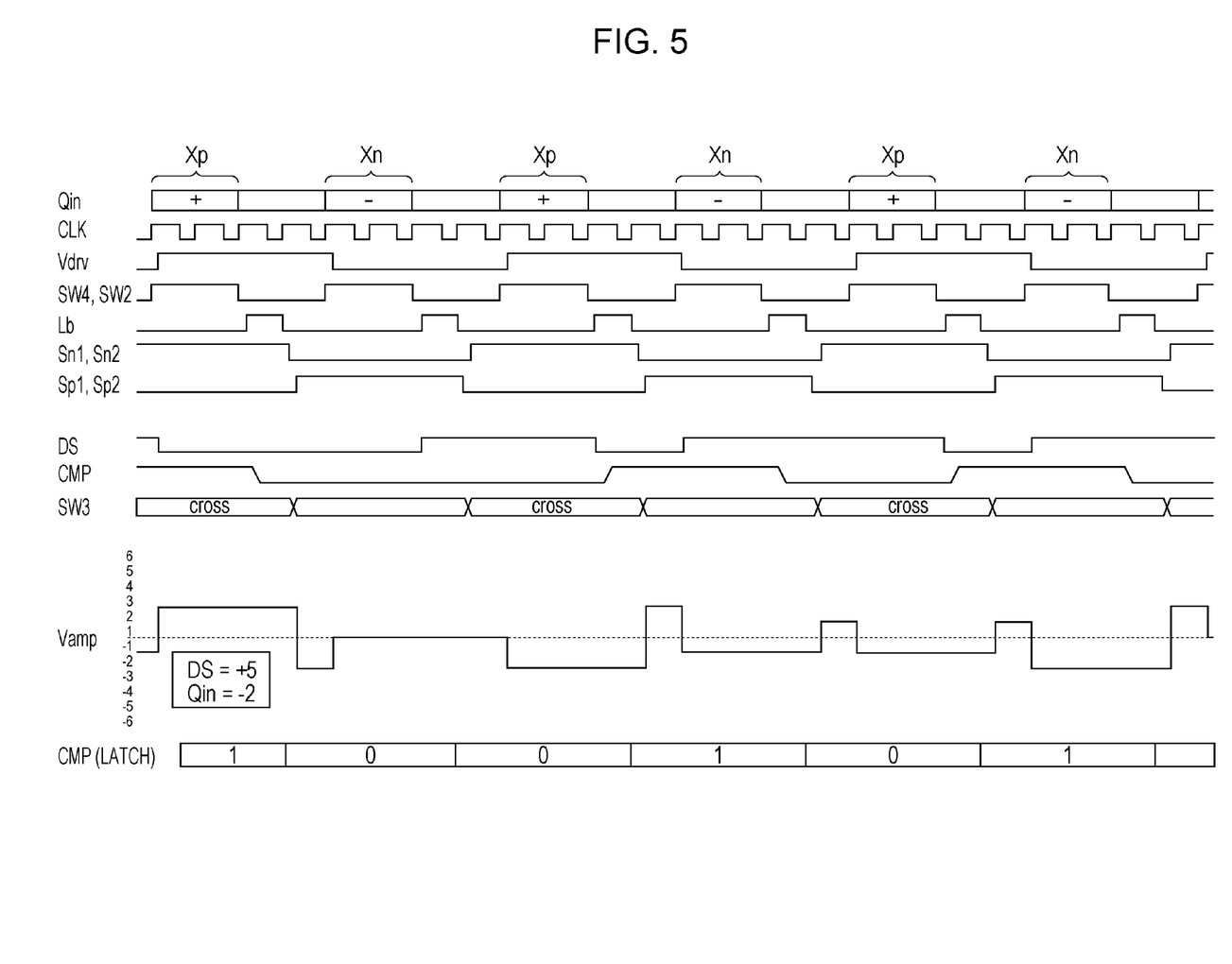
FIG. 5 is a diagram for describing a comparison example between the capacitance detection apparatus according to the present embodiment and an existing circuit illustrated in FIG. 6, and is a timing chart illustrating the operation timings of the portions of the capacitance detection apparatus according to the present embodiment.
Figure 7:
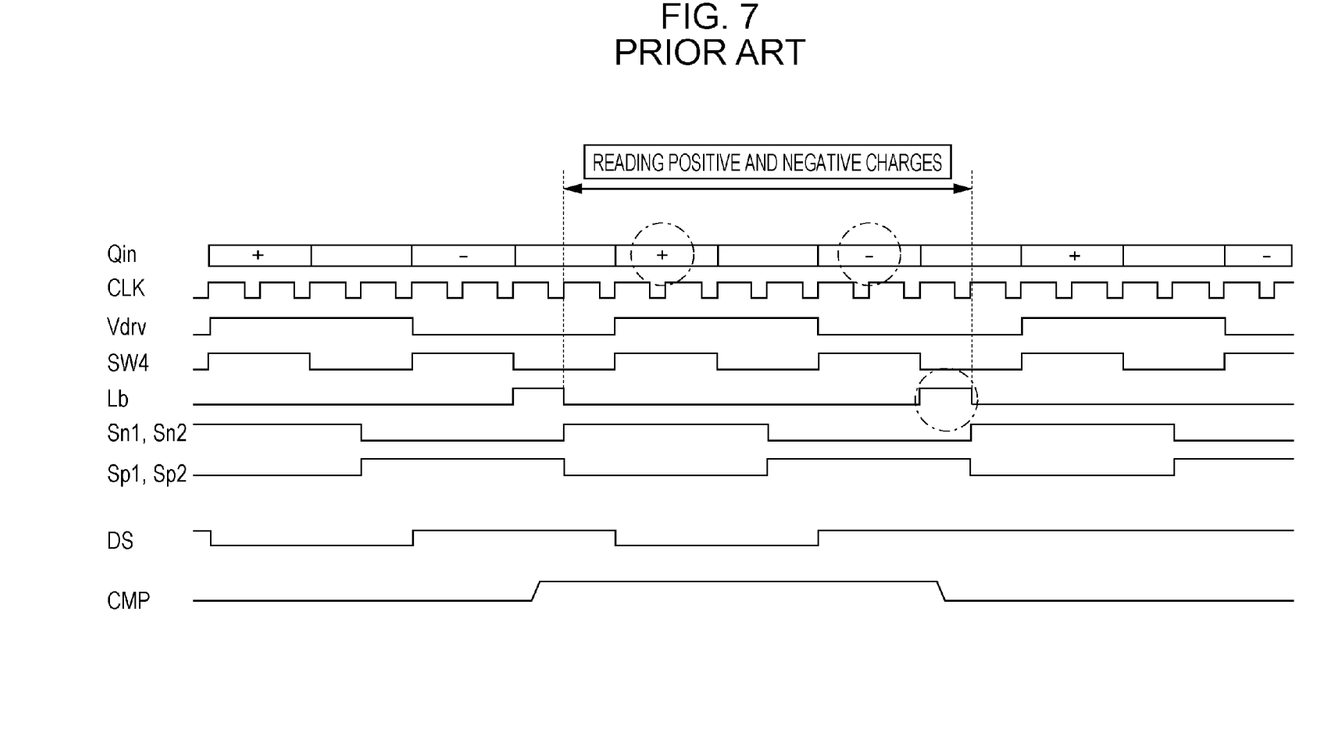
FIG. 7 is a timing chart illustrating the operation timings of the portions of the existing circuit illustrated in FIG. 6.

FIG. 4 and FIG. 5 are diagrams illustrating an example of a comparison between the capacitance detection apparatus 2 according to the present embodiment and an existing circuit illustrated in FIG. 7 for the case where a charge is transferred from the capacitive sensor SE under the same condition. FIG. 4 illustrates the timing chart of the existing circuit and FIG. 5 illustrates the timing chart of the capacitance detection apparatus 2 according to the present embodiment.

Charts "Vamp" in FIG. 4 and FIG. 5 each schematically illustrate a change in the output voltage Vamp of the voltage control circuit 301 (the operational amplifier 101). The numeric values in the figures relatively represent the values of the output voltage Vamp. In the examples of FIG. 4 and FIG. 5, in the case where the feedback charge Qds is supplied from the second capacitor C2 to the first node N1, the voltage Vc1 of the first capacitor C1 drops by 5. On the other hand, every time a charge transferred from the capacitive sensor SE is accumulated, the voltage of the first capacitor C1 increases by 2.

As illustrated in FIG. 4, in the existing circuit, the signal CMP is output only once during two charge transfer periods (Xp, Xn). Further, when the signal CMP of "1" is output once in the comparator 102, during the two charge transfer periods (Xp, Xn), the voltage Vc1 of the first capacitor C1 decreases by 5 in each period, a total decrease of 10. Hence, the time required for the voltage Vc1 to return to close to zero due to the transferred charge Qin increases.

On the other hand, as illustrated in FIG. 5, in the capacitance detection apparatus 2 according to the present embodiment, a comparison operation is performed by the comparison circuit 31 and the signal CMP of the comparison result is output in every charge transfer period. Further, when the signal CMP of "1" is output once in the comparison circuit 31, the feedback charge Qds is supplied only once by the feedback circuit 32 and, hence, a decrease in the voltage Vc1 of the first capacitor C1 is only 5. As a result, the time required for the voltage Vc1 to return to close to zero due to the transferred charge Qin is shorter than in the existing circuit illustrated in FIG. 6.

The capacitance detection speed of the capacitance detection apparatus 2 according to the present embodiment is about twice that of the existing circuit illustrated in FIG. 6. In other words, the capacitance detection apparatus 2 according to the present embodiment generates the signal CMP in a time approximately half that in the circuit illustrated in FIG. 6 for the same bit pattern.

As described above, according to the present embodiment, at the first timing TM1 during the period after the transfer of a positive charge has ended and before the transfer of a negative charge starts, and at the second timing TM2 during the period after the transfer of a negative charge has ended and before the transfer of a positive charge starts, the voltage Vc1 of the first capacitor C1 is compared with a threshold voltage, and the signal CMP corresponding to the comparison result is generated. Further, in the case where the signal CMP of "1" showing that the voltage Vc1 of the first capacitor C1 has exceeded a threshold voltage at the first timing TM1, when the subsequent negative charge is transferred, a positive charge due to the feedback circuit 32 is added to the transferred negative charge and the sum is input to the charge accumulation circuit 30, whereby the voltage Vc1 of the first capacitor C1 becomes lower than the threshold voltage. Also in the case where the signal CMP of "1" showing that the voltage Vc1 of the first capacitor C1 has exceeded the threshold voltage is output from the comparison circuit 31 at the second timing TM2, when the subsequent positive charge is transferred, the negative charge due to the feedback circuit 32 is added to the transferred positive charge and the sum is input to the charge accumulation circuit 30, whereby the voltage Vc1 of the first capacitor C1 becomes lower than the threshold voltage.

In other words, in each of the case where a positive charge is transferred and the case where a negative charge is transferred, an operation (digitization of an integrated value, output signal feedback) of a delta sigma modulator is performed. Hence, the detection speed can be increased, compared with the existing circuit in which the result of comparison between the capacitor voltage and the threshold voltage cannot be obtained without transferring charges twice (a positive charge and a negative charge) to a capacitor.

Further, according to the present embodiment, control of the second switch circuit SW2 and control of the input switch circuit SW4 can be unified, and control of the third switch circuit SW3 and control of the first switch circuit SW1 can also be unified. Hence, the circuit configuration can also be simplified.

Several embodiments of the present invention have been described above. However, the present invention is not limited to these embodiments and includes various variations.

In the embodiments described above, in the case where the comparison circuit 31 outputs the signal CMP of "0" showing that the voltage of the first capacitor C1 has not exceeded a threshold voltage at the first timing TM1 or the second timing TM2, the output voltage level of the drive circuit 321 is switched (the value of the signal DS is inverted) in a state in which one terminal of the second switch circuit SW2 is connected to the reference voltage Vref, after the subsequent charge transfer period (Xp, Xn) has ended.

However, when the one terminal of the second capacitor C2 is in a state of being connected to the reference voltage Vref, the feedback charge Qds is not supplied from the second capacitor C2 to the first node N1 even when the output voltage level of the drive circuit 321 is switched. Hence, in the case where the connection of the second switch circuit SW2 is controlled in accordance with the value of the signal CMP, the timing of switching the output voltage level of the drive circuit 321 when the signal CMP is "0" is not limited to being after the end of the charge transfer period (Xp, Xn).

For example, in another embodiment of the present invention, in the case where the signal of "1" showing that the voltage Vc1 of the first capacitor C1 has exceeded the threshold voltage at the first timing TM1 or the second timing TM2, the second switch circuit SW2 connects one terminal of the second capacitor C2 to the first node N1 during the subsequent charge transfer period (Xp, Xn).

On the other hand, in the case where the comparison circuit 31 outputs the signal CMP of "0" showing that the voltage Vc1 of the first capacitor C1 has not exceeded a threshold voltage at the first timing TM1 or the second timing TM2, the second switch circuit SW2 connects one end of the second capacitor C2 to the reference voltage Vref during the subsequent charge transfer period (Xp, Xn).

In this case the feedback control circuit 322 need only switch the output voltage level of the drive circuit 321 during the charge transfer period (Xp, Xn), and the timing of switching need not be changed in accordance with the signal CMP of the comparison circuit 31.

What is claimed is:

1. A capacitance detection apparatus in which a positive charge and a negative charge whose amounts correspond to a capacitance to be detected are alternately transferred, the apparatus comprising:

a charge accumulating circuit that includes a first capacitor having a first electrode and a second electrode, accumulates the transferred negative charge in the first electrode of the first capacitor, and accumulates the transferred positive charge in the second electrode of the first capacitor;

a comparison circuit that compares, at each of a first timing during a period after transfer of the positive charge has ended and before transfer of the negative charge starts and a second timing during a period after the transfer of the negative charge has ended and before the transfer of the positive charge starts, a voltage of the first capacitor, which is a voltage of the second electrode with respect to a voltage of the first electrode, with a threshold voltage, and outputs a signal corresponding to the comparison result;
a feedback circuit that, in a case where a signal showing that the voltage of the first capacitor has exceeded the threshold voltage at the first timing is output from the comparison circuit, when a subsequent negative charge is transferred, inputs to the charge accumulating circuit a sum of the transferred negative charge and a positive charge that makes the voltage of the first capacitor lower than the threshold voltage, and in a case where a signal showing that the voltage of the first capacitor has exceeded the threshold voltage at the second timing is output from the comparison circuit, when a subsequent positive charge is transferred, inputs to the charge accumulating circuit a sum of the transferred positive charge and a negative charge that makes the voltage of the first capacitor lower than the threshold voltage;
a first node to which the alternately transferred positive charge and negative charge are input; and
a second node,
wherein the charge accumulating circuit includes:
  a first switch circuit that, during charge transfer periods in which the negative charge is transferred to the first node, connects the first electrode of the first capacitor to the first node and connects the second electrode of the first capacitor to the second node, and during charge transfer periods in which the positive charge is transferred to the first node, connects the second electrode of the first capacitor to the first node and connects the first electrode of the first capacitor to the second node, and
  a voltage control circuit that controls a voltage of the second node such that a voltage of the first node becomes equal to a supply line; and
wherein the feedback circuit includes:
  a second capacitor;
  a second switch circuit that connects, in a case where a signal indicating that the voltage of the first capacitor has exceeded the threshold voltage at the first timing or the second timing is output from the comparison circuit, one terminal of the second capacitor to the first node during a subsequent charge transfer period and connects, in a case where a signal showing that the voltage of the first capacitor has not exceeded the threshold voltage at the first timing or the second timing is output from the comparison circuit, the one terminal of the second capacitor to a reference voltage supply line during the subsequent charge transfer period such that a charge of the second capacitor is discharged to the reference voltage supply line;
  a drive circuit that is able to switch one level to another level among two levels of an output voltage; and
  a feedback control circuit that switches an output voltage level of the drive circuit during the charge transfer period.

2. The capacitance detection apparatus circuit according to claim 1, wherein the feedback circuit includes:
  a second capacitor;
  a second switch circuit that connects one terminal of the second capacitor to the first node during the charge transfer periods and connects the one terminal of the second capacitor to the reference voltage supply line during intervals between the charge transfer periods;
  a drive circuit that is capable of switching one of two output voltage levels to the other of the two output voltage levels; and
  a feedback control circuit that, in a case where a signal showing that a voltage of the first capacitor has exceeded the threshold voltage at the first timing or the second timing is output from the comparison circuit, switches an output voltage level of the drive circuit during a subsequent charge transfer period, and in a case where a signal showing that the voltage of the first capacitor has not exceeded the threshold voltage at the first timing or the second timing is output from the comparison circuit, switches the output voltage level of the drive circuit after the subsequent charge transfer period has ended.

3. The capacitance detection apparatus circuit according to claim 2, further comprising an input switch circuit that is provided on a path through which the positive charge and the negative charge are transferred to the first node, that is turned on during the charge transfer period, and that is turned off in intervals between the charge transfer periods,
  wherein connection of the second switch circuit is switched at the same timing as the input switch circuit.

4. The capacitance detection apparatus circuit according to claim 1, wherein the comparison circuit includes:
  a comparator that compares a voltage of a first input terminal with a voltage of a second input terminal at the first timing and the second timing and outputs signals corresponding to the comparison results; and
  a third switch circuit that connects the first input terminal to the second node and connects the second input terminal to the reference voltage supply line at the first timing, and that connects the second input terminal to the second node and connects the first input terminal to the reference voltage supply line at the second timing.

5. The capacitance detection apparatus according to claim 4, wherein connection of the third switch circuit is switched at the same timing as the first switch circuit.

6. The capacitance detection apparatus according to claim 1, wherein:
  when a feedback charge is discharged from the second capacitor to the first node; or when a charge is output from the second capacitor to the reference voltage supply line;
  an amount of charge generated when the output voltage of the drive circuit is switched a subsequent time is about the same.

* * * * *